US012568292B2

(12) United States Patent (10) Patent No.: US 12,568,292 B2
Adamczyk (45) Date of Patent: Mar. 3, 2026

(54) DIGITAL CAMERA THAT COMPENSATES FOR TEMPERATURE DRIFT OF AN IMAGE

(71) Applicant: POLITECHNIKA WARSZAWSKA, Warsaw (PL)

(72) Inventor: Marcin Adamczyk, Warsaw (PL)

(73) Assignee: POLITECHNIKA WARSZAWSKA, Warsaw (PL)

( * ) Notice: Subject to any disclaimer, the term of this patent is extended or adjusted under 35 U.S.C. 154(b) by 105 days.

(21) Appl. No.: 18/733,044

(22) Filed: Jun. 4, 2024

(65) Prior Publication Data

US 2024/0323502 A1 Sep. 26, 2024

Related U.S. Application Data

(63) Continuation-in-part of application No. PCT/IB2023/058662, filed on Sep. 1, 2023.

(30) Foreign Application Priority Data

Sep. 2, 2022 (PL) ........................................ 442191

(51) Int. Cl.
*H04N 23/52* (2023.01)
*H04N 23/00* (2023.01)
(Continued)

(52) U.S. Cl.
CPC ............. *H04N 23/52* (2023.01); *H04N 23/54* (2023.01); *H04N 25/60* (2023.01); *H05K 1/18* (2013.01); *H05K 2201/10151* (2013.01)

(58) Field of Classification Search
CPC ........ H04N 23/52; H04N 23/54; H04N 25/60; H04N 5/33; H04N 23/00; H05K 1/18; H05K 2201/10151; G06T 7/00
See application file for complete search history.

(56) References Cited

U.S. PATENT DOCUMENTS

| | | | | |
|---|---|---|---|---|
| 6,654,064 B2 * | 11/2003 | Ishikawa | ................ | H04N 23/54 |
| | | | | 257/E31.118 |
| 7,714,931 B2 * | 5/2010 | Singh | .................... | H10F 39/804 |
| | | | | 348/374 |
| 10,582,101 B2 * | 3/2020 | Graff | ..................... | H04N 23/55 |

FOREIGN PATENT DOCUMENTS

| | | |
|---|---|---|
| CN | 110798593 | 2/2020 |
| CN | 111182240 | 5/2020 |

(Continued)

OTHER PUBLICATIONS

PCT/DE2023/058662 Written Opinion dated Dec. 13, 2023.
(Continued)

*Primary Examiner* — Ahmed A Berhan
(74) *Attorney, Agent, or Firm* — Ralph E. Jocke; WALKER & JOCKE

(57) ABSTRACT

Exemplary arrangements relate to a digital camera (10). The camera includes a PCB plate (12) including electronic image sensor (24). The PCB plate is mounted to a base plate (16) through flexures (38, 54) that are operative to cause the PCB plate to be suspended and disposed away from the base plate except at PCB mount portions (32), and the electronic image sensor on the PCB plate and the base plate, to be frictionlessly resiliently repeatedly relatively movable responsive to thermal expansion and contraction. Exemplary arrangements enable the circuitry of the digital camera to compensate for temperature drift of image data.

20 Claims, 5 Drawing Sheets

(51) Int. Cl.
    *H04N 23/54*     (2023.01)
    *H04N 25/60*     (2023.01)
    *H05K 1/18*     (2006.01)

(56)         References Cited

FOREIGN PATENT DOCUMENTS

| | | |
|---|---|---|
| CN | 112270712 | 1/2021 |
| CN | 112393808 | 2/2021 |
| DE | 102019215187 | 4/2021 |
| WO | 2021164058 | 4/2020 |

OTHER PUBLICATIONS

PCT/DE2023/058662 International Search Report dated Dec. 13, 2023.

English Translation of PCT/IB2023/058662 Application dated Sep. 1, 2023.

Holger Handel, Analyzing the Influences of Camera Warm-Up Effects on Image Acquisition, IPSJ Transactions on Computer Vision and Applications, Jan. 2009, pp. 12-20, vol. 1, © 2009 Information Processing Society of Japan.

Holger Handel, Analyzing the influence of camera temperature on the image acquisition process, SPIE-IS&T, Three-Dimensional Image Capture and Applications 2008, pp. 1-8, vol. 6805, vol. 6805, © 2008 SPIE-ES&T 0277-786X/08.

Holger Handel, Compensation of thermal errors in vision based measurement systems using a system identification approach, ICSP2008 Proceedings, pp. 1329-1333, Institute for Computational Medicine (ICM), Central Institute for Computer Engineering, University of Heidelberg, B6, 27-29, 68131 Mannheim Germany.

\* cited by examiner

DIGITAL CAMERA THAT COMPENSATES FOR TEMPERATURE DRIFT OF AN IMAGE

TECHNICAL FIELD

Exemplary arrangements relate to digital cameras. Exemplary arrangements further relate to a digital camera that includes a suspension system for an image sensor that enables compensation for the temperature drift of image data captured by the image sensor.

BACKGROUND

Digital cameras which for purposes hereof include image capture devices such as 2D cameras and 3D scanners, commonly include circuitry with a photosensitive image sensor. Such photosensitive image sensors may include for example, Charge Couple Device (CCD) sensors, Complementary Metal Oxide Semiconductor (CMOS) sensors and other sensors that produce signals with data that correspond to visual images. The circuitry receives the data from the at least one image sensor and is operative to produce signals including data which are usable to produce outputs corresponding to images and/or image features.

In most cases it is assumed that after calibrating a digital camera, its imaging parameters (intrinsic, extrinsic parameters and distortion correction parameters) remain unchanged.

However, due to the camera being exposed to changing environmental conditions, output image data for a fixed image or a fixed frame of reference may change. One of the environmental parameters that effects camera calibration is temperature. The influence of temperature on the imaging process of the camera often manifests itself generally in two ways. There is often an observed image drift associated with the warming up process of the camera. There is also often a temperature drift in the image associated with a change in ambient temperature to which the camera is exposed.

The image drift can be significant when it is desirable to determine the difference in position and/or configuration of objects in a plurality of images. The fidelity of the image may be important in circumstances such as medical scans, satellite photos, documentation of crime scenes, documentation of cultural heritage artifacts, and in other situations where captured images in order to be correctly used and analyzed, must be based on a reliable image without any shifting in space in relation to the actual position or configuration of objects in the image.

In some arrangements the drift in images caused by changes in temperature may cause the shifting and deforming of the position and/or configuration of an object in a captured image. In some cameras the shifting can be up to 1.5-2 pixels from the expected position on the photosensitive image sensor. On large cameras the image drift caused by changes in temperature may be even larger, such as several pixels. Such image drift may inaccurately indicate an apparent physical shift in the location or configuration of an object included in the image depending on the nature of the object of which an image is being captured and the nature of the lens that is being used.

While attempts have been made to deal with the problems which can result due to the thermal drift of images captured by a digital camera, satisfactory solutions have been elusive. As a result, digital cameras may benefit from improvements.

SUMMARY

Exemplary arrangements relate to providing mounting arrangements for an electronic image sensor in a digital camera. The exemplary arrangements provide a mount which operatively suspends the Printed Circuit Board (PCB) plate which includes the electronic image sensor through mounting arrangements that include flexures. The flexures of the exemplary mounting arrangements enable the electronic image sensor on the PCB plate and a base plate to which the PCB plate is releasably connected, to frictionlessly and resiliently move relative to one another in a manner responsive to thermal expansion and contraction, in a manner that is repeatable and thereby predictable.

In exemplary arrangements the ability to repeatedly and predictably reproduce the relative movement of the PCB plate and its base plate responsive to temperature changes enables circuitry in the digital camera to compensate for temperature drift of an image captured by the photosensitive electronic image sensor. The exemplary circuitry is in operative connection with a temperature sensor that is operative to sense the temperature adjacent to the PCB plate. The circuitry is operative responsive at least in part to the temperature sensor to compensate for the temperature drift of the image data captured through operation of the electronic image sensor. In exemplary arrangements the circuitry is operative to carry out the temperature drift correction calculations, responsive at least in part to a polynomial compensation model which comprises circuit stored calculation steps and data which enable the circuitry to be operative to adjust the signals and data that are output by the circuitry responsive to the currently sensed temperature.

Numerous different features and relationships of exemplary arrangements are described in the following Detailed Description and shown in the appended Drawings.

DETAILED DESCRIPTION

Figure 1:
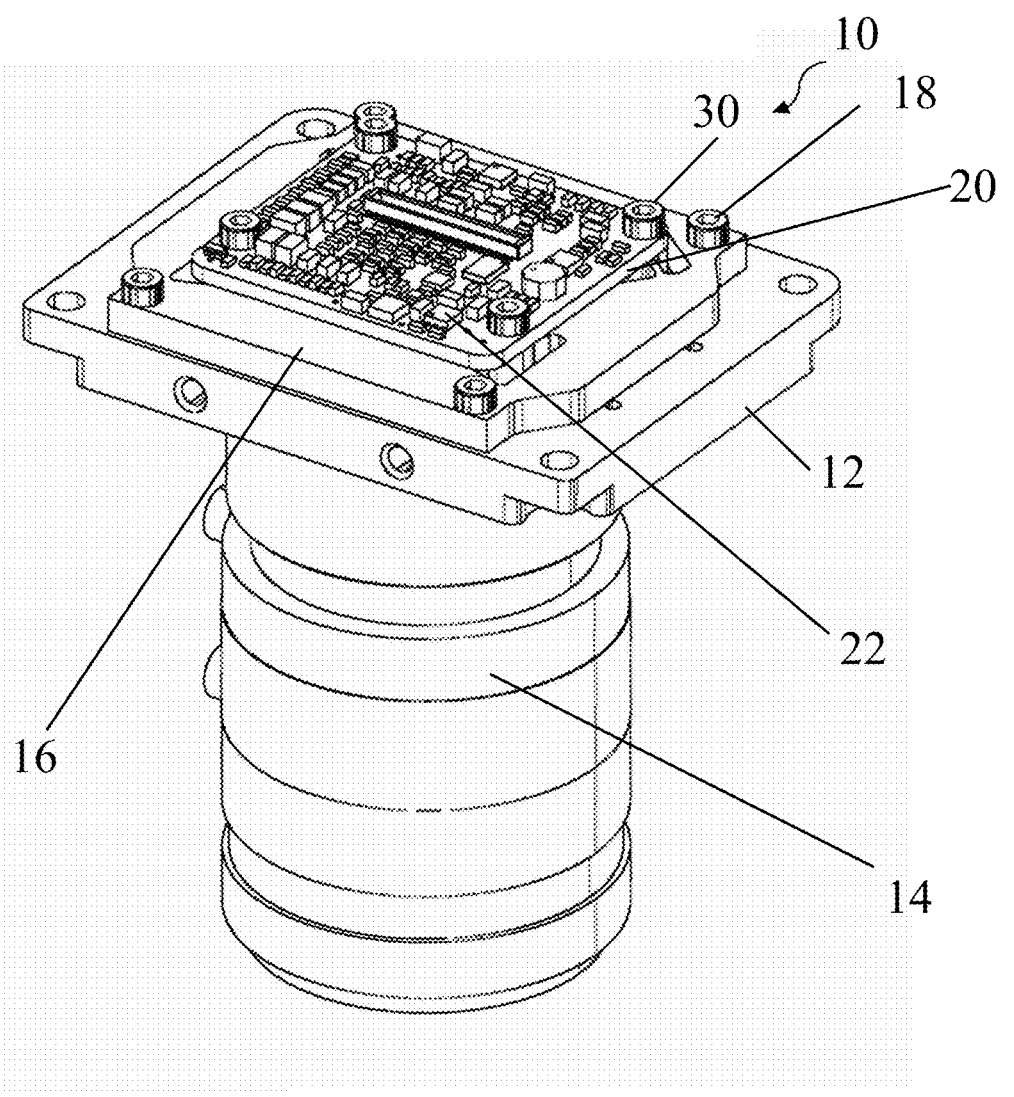
FIG. 1 is a perspective rear view of internal components of the digital camera including a PCB plate in attached connection with a base plate and a camera body which has a lens attached thereto.

Referring now to the drawings and particularly to FIG. 1, there is shown therein an exemplary digital camera generally indicated 10. The digital camera that is shown includes only a portion of the components which make up the camera and include only those components that are pertinent to the explanation of the exemplary arrangements. It should be understood that the digital camera may include an external case, a camera mount, input and output devices, a display device and other components which facilitate the use thereof.

The exemplary camera components shown include a body 12. The exemplary body is configured to be releasably engageable with a lens 14. As can be appreciated numerous different types of lenses may be engaged with the camera body. It should also be understood that although in exemplary arrangements the lens may be suitable for capturing visually perceivable images, in other arrangements the lens may be configured for capturing and directing nonvisible radiation depending on the purpose for which the camera is used.

In the exemplary arrangement a base plate 16 is attached to the camera body. The exemplary base plate is releasably attached to the camera body through a plurality of releasable fasteners 18 such as threaded screws. In the exemplary arrangement the fasteners are configured to hold the base plate 16 in fixed engagement with the camera body 12.

Figure 3:
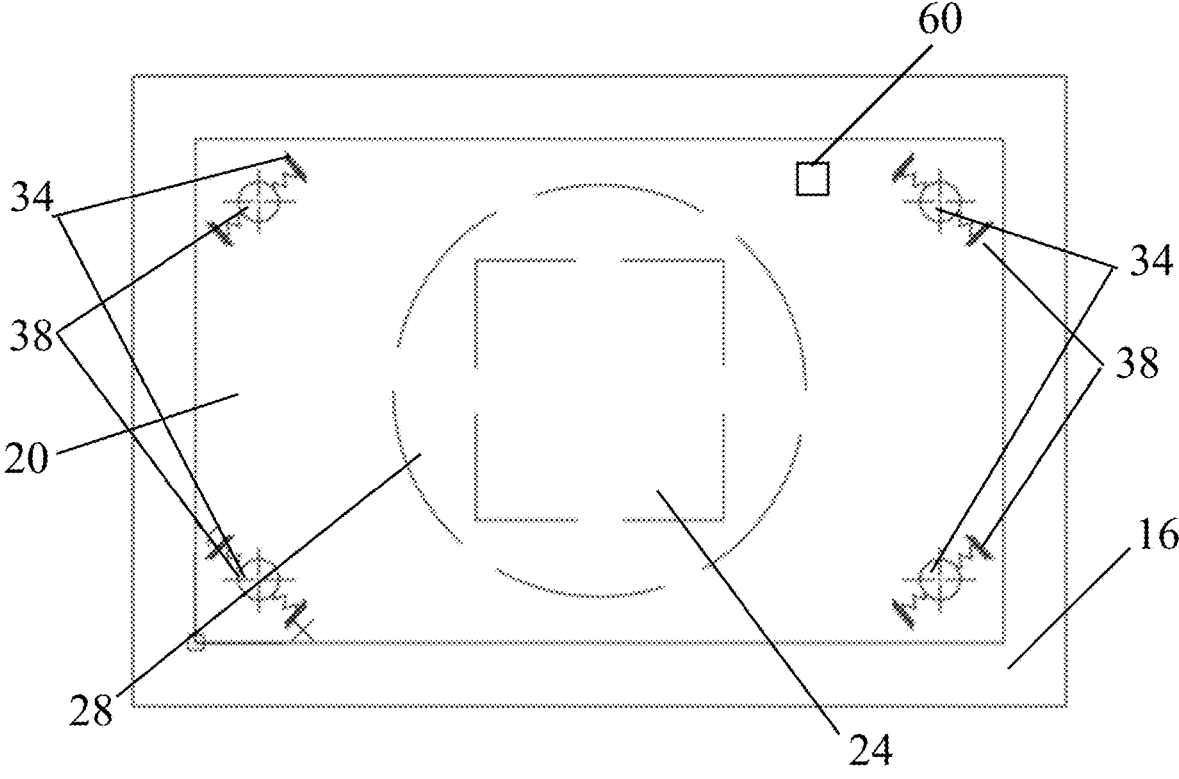
FIG. 3 is a schematic front view of the base plate and the PCB plate with the PCB mount portions shown schematically.

The exemplary camera further includes a PCB plate 20. The exemplary PCB plate includes circuitry 22. The exemplary circuitry 22 includes an electronic image sensor 24 as schematically shown in FIG. 3 for example. In exemplary arrangements the electronic image sensor 24 may comprise a CCD sensor, CMOS sensor or other suitable sensor for capturing image data. The exemplary electronic image sensor is a photosensitive sensor that is in fixed attached connection with the PCB plate and receives and captures image data. The exemplary electronic image sensor receives light corresponding to an image through the lens 14 and through a respective opening 26 in the body 12 and a respective opening in the base plate 28. Of course it should be understood that this arrangement is exemplary and in other arrangements other approaches may be used.

In the exemplary arrangement the PCB plate 16 is held in releasable engagement with the base plate through a plurality of fasteners 30. In the exemplary arrangement shown the releasable fasteners comprise a plurality of screws. However it should be understood that in other arrangements other types and numbers of fasteners may be utilized. Such fasteners may include for example threaded studs, bolts, nuts and other such fasteners which may be utilized to hold the PCB plate and the base plate in fixed operative engagement.

Figure 2:
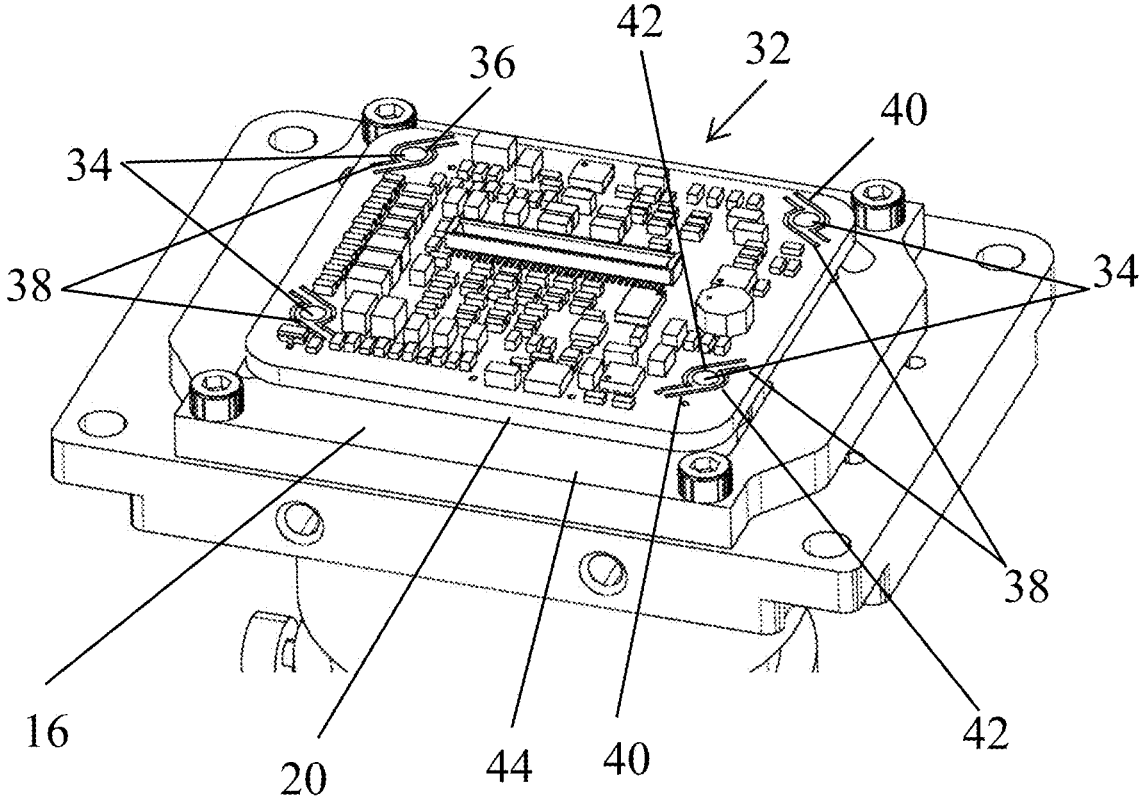
FIG. 2 is a perspective rear view similar to FIG. 1 but with the fasteners removed to show the PCB mount portions including the exemplary flexures thereof.

As shown in FIG. 2 in the exemplary arrangement the PCB plate includes a plurality of PCB mount portions 32. In the exemplary arrangement the PCB plate is rectangular and includes PCB mount portions at the corners thereof. However it should be understood that in other arrangements the PCB plate may have only two PCB mount portions, or may have other numbers and configurations of PCB mount portions. In the exemplary arrangement each PCB mount portion is resiliently attached to the remainder of the PCB plate through at least one flexure.

In the exemplary arrangement shown the PCB mount portions 32 each include a mount disc portion 34. Each mount disc portion 34 includes a PCB mount fastener opening 36. The PCB mount fastener opening is configured to receive a fastener therein. Each PCB mount disc portion 34 is in attached connection with the remainder the PCB plate through at least one flexure which in the exemplary arrangement comprises a pair of flexible ribs 38. In the exemplary arrangement the flexible ribs 38 extend from the mount disc portion in opposed directions as shown. The exemplary flexible ribs are bounded by slots 40 which extend through the material of the PCB plate. In exemplary arrangements the ribs are configured so that they extend away from the mount disc portion in opposed relation at a respective angle that corresponds to a tangent of the immediately adjacent PCB mount disc portion. In the exemplary arrangements the slots 40 extend arcuately adjacent to the mount disc portion such that a curved PCB aperture 42 extends through the PCB plate arcuately intermediate of each of the ribs 38. Of course it should be understood that this configuration is exemplary and in other arrangements other approaches and flexure configurations may be used.

In exemplary arrangements the PCB mount portions 32 are configured so that the remainder of the PCB plate 20 is suspended and disposed away from the base plate 16 except at the PCB mount portions 32. In the exemplary arrangement the base plate 16 includes a planar base plate surface 44 that extends in facing relation with the PCB plate 20. The exemplary PCB mount portions are configured such that the PCB plate is disposed away from the base plate surface 44 except at the PCB mount portions. In exemplary arrangements this may be accomplished by the mount disc portions having an annular lower face that extends toward the base plate such that the PCB plate is disposed away from the base plate surface 44 except in the area of the mount disc portions. Alternatively structures such as non-resilient spacers may be positioned intermediate of the base plate and the PCB plate to dispose the PCB plate away from the base plate except that the mount portions. Alternatively the base plate may include raised projections or other similar structures such as those later discussed that are operative to provide the suspended mounting of the PCB plate relative to the base plate.

In some exemplary arrangements the base plate may include suitable base mount fastener openings that are in aligned relation with the PCB mount fastener openings 36 in the PCB plate. Base mount fastener openings may be configured to be in fixed relation with the base plate and may receive fasteners 30 therein. In such an exemplary arrangement the PCB plate is in attached connection with the base plate through the fasteners and the mount disc portions. However, such mounting provides for the portion of the PCB plate which includes the electronic image sensor and the base plate to be resiliently frictionlessly playlessley relatively movable through deformation of the flexible ribs which operatively connect each of the mount disc portions to the remainder of the PCB plate.

In exemplary arrangements the ability of the base plate and the PCB plate that includes the electronic image sensor to be resiliently frictionlessly relatively movable enables such relative movement responsive to thermal expansion and contraction of the PCB plate and the base plate. Such resilient and frictionless and playless relative movement provides repeatability for the relative movement and the relative positions of the electronic image sensor on the PCB plate and the base plate responsive to changes in temperature, which enables the circuitry of the digital camera to provide thermal drift compensation in a manner like that later discussed.

In other exemplary arrangements a suitable frictionless resilient repeatable relatively movable mounting arrangement for the electronic image sensor may be achieved by providing mounting features in the base plate. In such arrangements the resilient PCB mount portions previously described may not be included in the PCB plate. Alternatively in other exemplary arrangements a frictionless resilient repeatable relatively movable mounting arrangement may be provided by a suitable structure of the base plate and may be used in conjunction with frictionless resilient mounting arrangement for the PCB plate previously described. Such arrangements in which each of the PCB plate and the base plate includes such mounting features may further assure repeatable frictionless resilient relative movement of the electronic image sensor fixed on the PCB plate and the base plate responsive to expansion and contraction of such components due to temperature.

Figure 4:
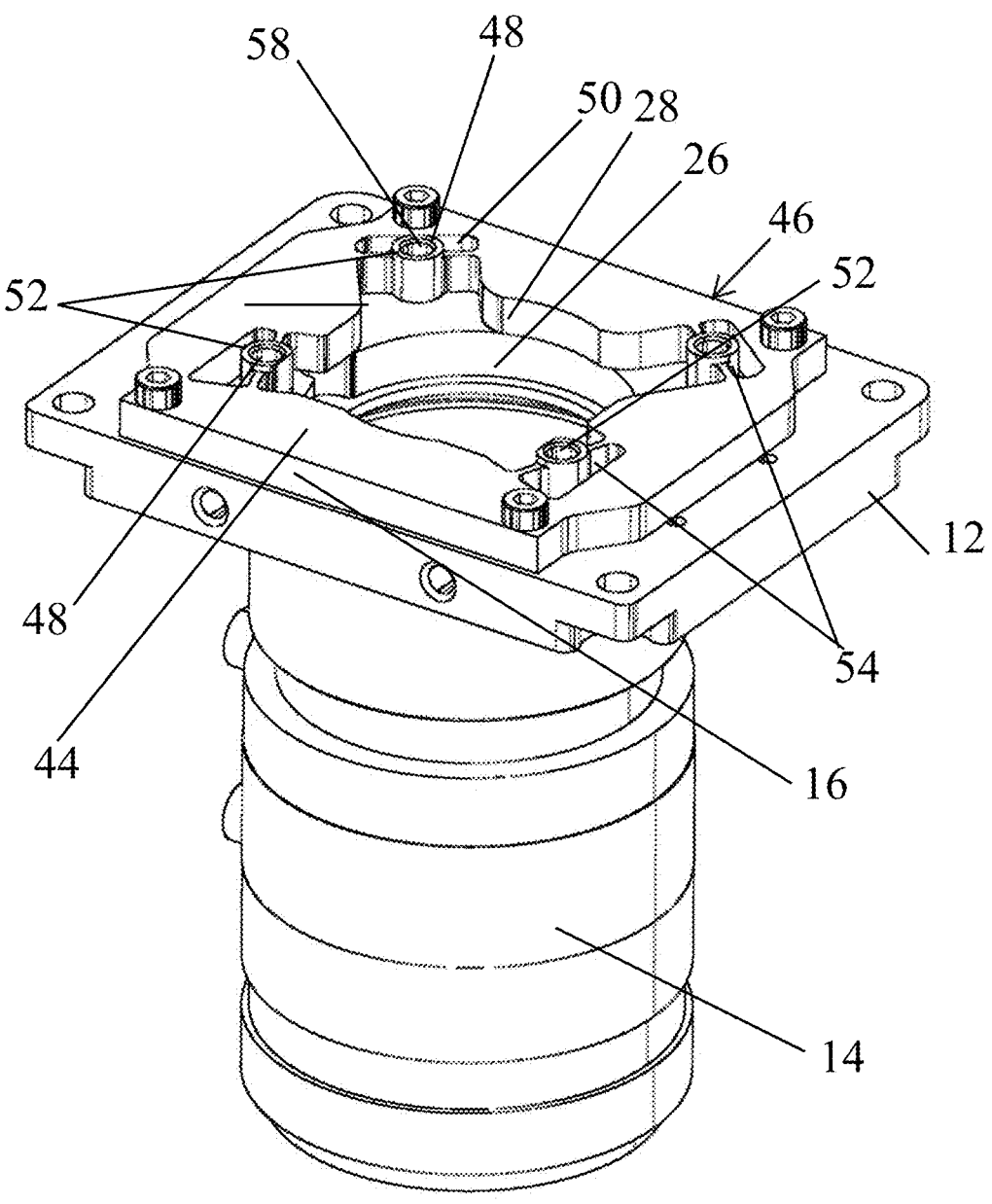
FIG. 4 is a perspective rear view of an exemplary base plate including the base mount portions and the flexures thereof.
Figure 5:
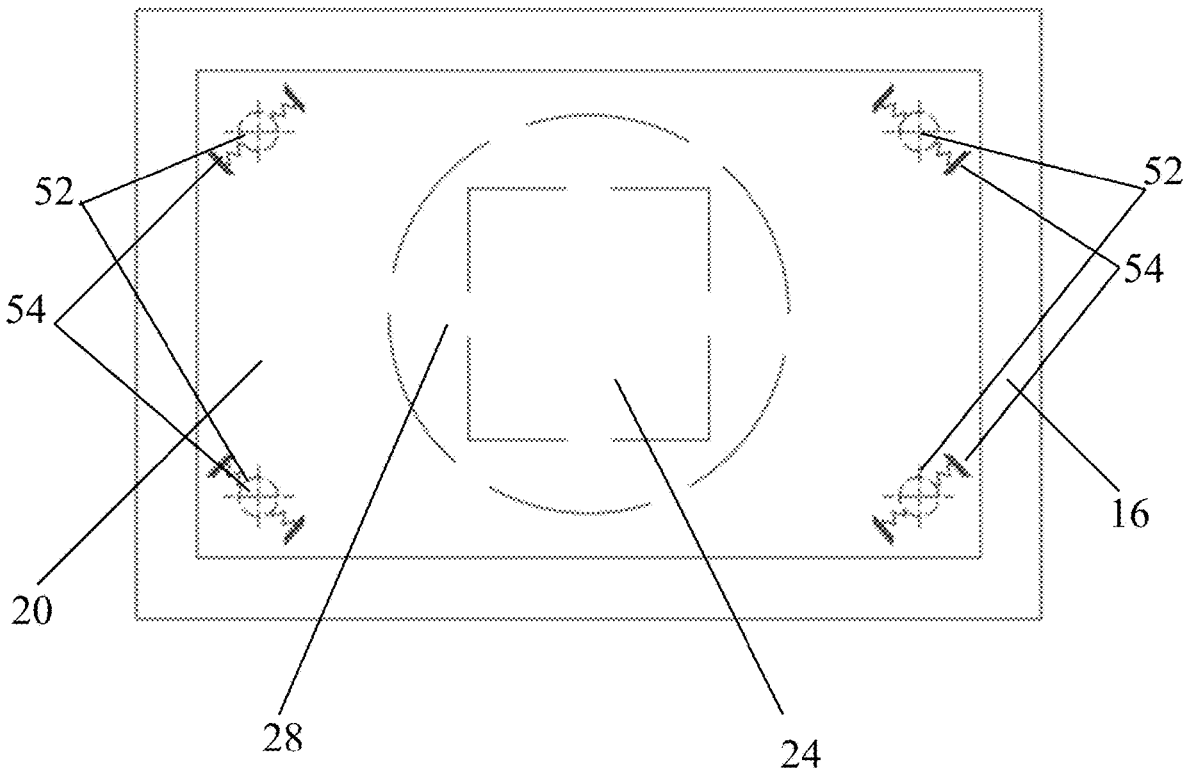
FIG. 5 is a schematic front view of the base plate and the base mount portions thereof.

In an exemplary arrangement providing a repeatable resilient frictionless mounting of the electronic image sensor of the PCB plate in connection with the base plate is shown in FIGS. 4 and 5. As shown in FIG. 4 the base plate 16 in the exemplary arrangement includes four base mount portions 46. The exemplary base mount portions are attached to the remainder of the base plate only through at least one base flexure, which in the exemplary arrangement comprises a pair of flexible ribs 48 associated with each base mount portion. In the exemplary arrangement each base mount portion 46 includes a base cylinder portion 48. Each base cylinder portion 48 is positioned in a respective recess 50 of the base plate. Each exemplary base cylinder portion 48 includes a base mount fastener opening 52. Each base mount fastener opening is axially centered in the respective base cylinder portion and is in axially aligned relation with the PCB mount fastener opening 36, or other mounting opening in the PCB plate in situations where the PCB plate does not include resilient PCB mount portions.

In the exemplary arrangement the base cylinder portions 48 are operatively connected to the remainder of the base plate 16 through the flexible ribs 54 which serve as flexures. In exemplary arrangements the flexible ribs 54 extend in opposed directions from the base cylinder portion into engagement with the remainder of the base plate 16. A base plate aperture 56 extends through the base plate and arcuately intermediate of the ribs 54. The exemplary ribs 54 extend in diametrically aligned relation with the base mount fastener opening 52 in the base cylinder portion 48. However it should be understood that in other arrangements other types of flexures and flexure configurations may be used.

In the exemplary arrangement each base cylinder portion and the ribs that are connected thereto are configured such that the ends thereof that are immediately adjacent to the body 12, are disposed away from the body 12 so as to enable frictionless relative movement of the body and the base cylinder portion and the ribs. Further in the exemplary arrangement each base cylinder portion 48 includes a top surface 58. The top surface 58 is an annular surface that extends in surrounding relation of the base mount fastener opening 52. The top surface extends beyond the planar base plate surface 44 in the direction toward the PCB plate 20. As a result in the exemplary arrangement the extension of each base based cylinder portion 48 beyond the base plate surface 44 causes the PCB plate to be disposed away from the surface 44. This further facilitates the repeatably resilient frictionlessly movable engagement between the base plate and the portion of the PCB plate that includes the electronic image sensor. Of course it should be understood that this configuration is exemplary and in other arrangements other approaches and configurations may be used.

In the exemplary arrangement shown the base plate 16 includes four base mount portions 46. This arrangement is utilized to correspond to the four PCB mount portions 32 of the exemplary PCB plate 20. However, it should be understood that in other exemplary arrangements only two disposed base mount portions may be utilized to mount and engage the PCB plate and the base plate so that the image sensor is suspended in a relatively movable, resilient, frictionless manner in which the relative movement is repeatable in response to thermal expansion and contraction of the base plate and the PCB plate. Of course numerous different numbers and configurations of base mount portions may be utilized in other arrangements.

Regardless of whether resilient PCB mount portions are included in the PCB plate, the exemplary base mount portions 46 provide for the PCB plate to be suspended and disposed away from the base plate except at the mounting locations at which the PCB plate and the base plate are engaged. Further the exemplary PCB mount portions 46 provide for the base plate 16 and the portion of the PCB plate 20 that includes the electronic image sensor 24 to be repeatably frictionlessly playlessly resiliently movable relative to one another responsive to thermal expansion and contraction of the PCB plate and the base plate. This repeatable relative movement enables the circuitry of the exemplary arrangement to compensate for temperature drift of image data that is captured through operation of the at least one electronic image sensor 24 of the digital camera.

Of course it should be understood that the flexures utilized to provide the repeatable and resilient relative movement between the base plate and the PCB plate which includes the electronic image sensor are exemplary. In other arrangements other types of flexure configurations may be utilized depending on the particular mounting configuration. For example in some exemplary arrangements instead of flexible ribs, other structures such as pin flexures, blade flexures, notch flexures or other suitable flexure types may be utilized with other appropriate structures to achieve the repeatable and resilient frictionless relative movement that enables correlating a sensed temperature adjacent to the PCB plate with the image drift due to thermal expansion and contraction and compensating for the image drift via suitable circuitry.

In exemplary arrangements the circuitry 22 associated with the digital camera 10 may operate to compensate for temperature drift of image data captured through operation of the at least one electronic image sensor 24. In exemplary arrangements the digital camera including one or both of the exemplary mounting arrangements which provide for repeatable frictionless, playless resilient relative movement of the image sensor responsive to thermal expansion and contraction may be provided. In such arrangements the camera may be provided with a temperature sensor schematically indicated 60. The temperature sensor is configured to sense the temperature adjacent to the PCB plate. It should be understood that such a sensor may be positioned on or next to the PCB plate including on or adjacent to the base plate or other cameras structures which are positioned in locations that are sufficiently close to provide a temperature reading indicative of the operating temperatures of the PCB plate and the base plate. Of course it should be understood that while only a single temperature sensor is shown, in other arrangements multiple temperature sensors may be used.

For purposes of initially calibrating circuitry which is operative to compensate for temperature drift of image data, the exemplary digital camera may be mounted through engagement of the body 12 with a fixed camera mount or stand. The circuitry of the camera may then be operated to capture image data corresponding to a fixed image in a fixed field of view of the electronic image sensor. In exemplary arrangements the fixed image may be in a fixed position relative to the camera so as to assure that image drift values that may be determined are due to thermal expansion and contraction and not due to relative movement of the image and the camera body.

In the exemplary arrangement the camera is operative to record and store the image data and to determine drift of edges or other features in the image data responsive to temperature change throughout a range of temperatures. In exemplary arrangements the temperature drift is recorded for the image data in steps of at least 1° C. throughout a temperature range of from −35° C. to 100° C. In exemplary arrangements the sensed temperature by the temperature sensor and the image drift of the features in fixed imaged object(s) are determined and recorded. In exemplary arrangements a suitable number of steps at different temperatures are utilized so to produce a polynomial compensation model. In some exemplary arrangements the steps for purposes of producing the polynomial compensation model utilizes temperature steps that vary from one another by 1° C. In other arrangements other temperature steps may be utilized. In some exemplary arrangements the images are captured through operation of the circuitry cyclically for example on a periodic basis such as capturing one image every second. Further for purposes of generating the data that is utilized for purposes of producing the polynomial compensation model, different fixed images or image features may be utilized. This may be done to compare image drift values for image features with different properties or configurations and in one or more directions in response to temperature changes.

In exemplary arrangements the recording and determination of the image drift for the fixed imaged object features throughout the temperature range is utilized to produce a polynominal compensation model which is implemented through circuit executable instructions that cause calculations that are carried out by the circuitry to compensate for image drift due to currently sensed temperature. For example in exemplary arrangements the circuitry may operate in response to the circuit executable instructions to determine a sensed temperature at the time of image capture and calculate the appropriate changes to the raw image data captured by the electronic image sensor to compensate for the image drift at the sensed temperature. As the camera is utilized to repeatedly capture the changing image data, the sensed temperature associated with the respective captured image data is utilized through operation of the circuitry to compensate in the output image data signals for the sensed temperature at which the image capture occurred. As a result the effects of the image drift are minimized and the image data produced provides a more accurate indication of the position, configuration, relative movement or other properties of objects in the captured images which are of interest.

As can be appreciated, the exemplary arrangements provide for a digital camera that includes circuitry that operates to automatically provide compensation for image drift that occurs due to changes in temperature. This includes compensation for image drift due to heat generated by the circuitry of the digital camera during operation as well as changes in the temperature of the environment in which the camera is used. The exemplary arrangements provide for resilient mounting of the at least one electronic image sensor relative to the structures of the camera that provides for a suspended resilient mounting that is frictionless and playless, and which provides repeatability that enables the camera circuitry to automatically compensate for temperature drift of image data. Of course it should be understood that the structures and methodologies described herein are exemplary and the principles disclosed herein may be used in other arrangements to achieve such useful results.

Thus the exemplary arrangements achieve improved operation, eliminate difficulties encountered in the use of prior devices and systems, and attain the useful results described herein.

In the foregoing description, certain terms have been used for brevity, clarity and understanding. However, no unnecessary limitations are to be implied therefrom because such terms are used for descriptive purposes and are intended to be broadly construed. Moreover the descriptions and illustrations herein are by way of examples and the new and useful features are not limited to the exact features that have been shown and described.

Having described features, discoveries and principles of the exemplary arrangements, the manner in which they are constructed and operated, and the advantages and useful results attained, the new and useful features, devices, elements, arrangements, parts, combinations, systems, equipment, operations, methods, processes and relationships are set forth in the appended claims.

What is claimed is:

1. Apparatus comprising:
a digital camera including
a printed circuit board (PCB) plate, wherein the PCB plate includes
an electronic image sensor,
at least two disposed PCB mount portions,
wherein each PCB mount portion includes a respective PCB mount fastener opening,
a base plate, wherein the base plate includes
at least two disposed base mount portions,
wherein each base mount portion includes a respective base mount fastener opening,
wherein each base mount fastener opening is in aligned relation with one respective PCB mount fastener opening,
at least two fasteners,
wherein each respective fastener is releasably engaged with a respective PCB mount opening and a respective base mount fastener opening and is operative to hold the PCB plate and the base plate in engaged relation,
wherein at least one of
each PCB mount portion is resiliently attached to a remainder of the PCB plate only through at least one PCB plate flexure, and
each base mount portion is resiliently attached to a remainder of the base plate only through at least one base flexure,
wherein the at least one PCB plate flexure and/or the at least one base flexure is operative to cause the PCB plate to be
disposed away from the base plate except at the PCB mount portions and the base mount portions, and
the electronic image sensor to be repeatedly frictionlessly resiliently movable relative to the base responsive to thermal expansion and contraction of the PCB plate and the base plate.

2. The apparatus according to claim 1
wherein each PCB mount portion comprises a respective PCB mount disc portion, and
wherein each at least one PCB plate flexure comprises a flexible rib.

3. The apparatus according to claim 1
wherein each PCB mount portion comprises a respective PCB mount disc portion, and
wherein the at least one PCB plate flexure comprises a pair of flexible ribs,
wherein the ribs extend in opposed directions from the respective PCB mount disc portion.

4. The apparatus according to claim 1
wherein each PCB mount portion comprises a respective PCB mount disc portion, and
wherein the at least one PCB plate flexure comprises a pair of flexible ribs,
wherein the ribs extend in opposed directions from the respective PCB mount disc portion and a PCB aperture extends through the PCB plate arcuately intermediate of the ribs.

5. The apparatus according to claim 1
wherein each PCB mount portion comprises a PCB mount disc portion, and
wherein each at least one PCB plate flexure comprises a flexible rib,
wherein the flexible rib extends at a tangent to the PCB mount fastener opening.

6. The apparatus according to claim 1
wherein each base mount portion comprises a base cylinder portion, and
wherein each at least one base flexure comprises a flexible rib.

7. The apparatus according to claim 1
wherein each base mount portion comprises a base cylinder portion, and
wherein each at least one base flexure comprises a pair of opposed flexible ribs.

8. The apparatus according to claim 1
wherein each base mount portion comprises a base cylinder portion, and
wherein each at least one base flexure comprises a pair of opposed flexible ribs,
and wherein a base plate aperture extends through the base plate arcuately intermediate of the ribs.

9. The apparatus according to claim 1
wherein each base mount portion comprises a base cylinder portion,
wherein the base cylinder portion includes the respective base mount fastener opening in axially centered relation,
wherein each at least one base flexure comprises a pair of opposed flexible ribs,
wherein the ribs are diametrically aligned with the respective base mount fastener opening.

10. The apparatus according to claim 1
wherein the PCB plate is rectangular,
wherein the PCB plate includes four PCB mount fastener openings, and wherein the base plate includes four base mount fastener openings,
wherein one respective PCB mount fastener opening is positioned adjacent to one respective corner of the rectangular PCB plate.

11. The apparatus according to claim 1
wherein each PCB mount portion is resiliently attached to the remainder of the PCB plate through at least one PCB plate flexure, and
each base mount portion is resiliently attached to the remainder of the base plate through at least one base flexure.

12. The apparatus according to claim 1
wherein each base mount portion comprises a base cylinder portion, and
wherein each at least one base flexure comprises a flexible rib,
wherein the base plate includes a planar base plate surface, wherein the base plate surface extends in facing relation with the PCB plate,
wherein each base cylinder portion extends beyond the base plate surface toward the PCB plate.

13. The apparatus according to claim 1
wherein the digital camera further includes
a temperature sensor, wherein the temperature sensor is operative to sense temperature adjacent to the PCB plate,
circuitry, wherein the circuitry is in operative connection with the electronic image sensor and the temperature sensor, wherein the circuitry is operative responsive at least in part to the temperature sensor to compensate for temperature drift of image data captured through operation of the electronic image sensor.

14. The apparatus according to claim 1
wherein the digital camera further includes
a temperature sensor, wherein the temperature sensor is operative to sense temperature adjacent to the PCB plate,
circuitry, wherein the circuitry is in operative connection with the electronic image sensor and the temperature sensor, wherein the circuity is operative to carry out temperature drift calculations responsive at least in part to temperature sensed by the temperature sensor and a polynomial compensation model,
wherein the temperature drift calculations are operative to compensate for temperature drift of image data captured through operation of the electronic image sensor.

15. The apparatus according to claim 1
wherein the digital camera further includes
a temperature sensor, wherein the temperature sensor is operative to sense temperature adjacent to the PCB plate,
circuitry, wherein the circuitry is in operative connection with the electronic image sensor and the temperature sensor, wherein the circuity is operative to carry out temperature drift calculations responsive at least in part to a temperature sensed by the temperature sensor and in accordance with a polynomial compensation model,
wherein the circuitry is operative responsive at least in part to the temperature sensor to compensate for temperature drift of image data captured through operation of the electronic image sensor,
wherein the polynomial compensation model is determined through a process including:
recording temperature drift in image data corresponding to a fixed image feature captured by the electronic image sensor, responsive to temperature change steps of at least 1° C. throughout a temperature range from −35° C. to a 100° C.

16. Apparatus comprising:
a digital camera including
a printed circuit board (PCB) plate, wherein the PCB plate includes
an electronic image sensor,
at least two PCB mount portions, wherein each PCB mount portion is disposed away from each of the other PCB mount portions on the PCB plate,
wherein each PCB mount portion is configured to releasably engage a respective fastener in fixed relation,
a base plate, wherein the base plate includes
at least two base mount portions, wherein each base mount portion is disposed away from each of the other base mount portions on the base plate,
wherein each base mount portion is configured to releasably engage a respective fastener in fixed relation,
at least two fasteners, wherein each respective fastener is configured to be releasably engaged with a respective PCB mount portion and a respective base mount portion, whereby the fasteners releasably hold the PCB plate and the base in engaged relation,
at least two flexures, wherein each flexure is configured to either
flexibly engage a respective PCB mount portion and the PCB plate, or flexibly engage a respective base mount portion and the base plate, wherein the at least two flexures are operative to cause the PCB plate to be disposed away from the base plate except at the PCB mount portions, and the electronic image sensor of the PCB plate and the base plate to be repeatedly resiliently frictionlessly relatively movable responsive to thermal expansion and contraction of each of the PCB plate and the base plate.

17. The apparatus according to claim 16
wherein the digital camera includes
at least four flexures, wherein at least two of the flexures are configured to flexibly engage a respective PCB mount portion and the PCB plate, and wherein at least two of the flexures are configured to flexibly engage a respective base mount portion and the base plate.

18. The apparatus according to claim 16
wherein each of the at least two flexures is configured to flexibly engage a respective PCB mount portion and a remainder the PCB plate, wherein each PCB mount portion comprises a respective PCB mount disc portion, and wherein each flexure comprises a flexible rib that extends between the PCB mount disc portion and the remainder of the PCB plate.

19. The apparatus according to claim 16
wherein each of the at least two flexures is configured to flexibly engage a respective base mount portion and remainer of the base plate, wherein the base plate includes a planar base plate surface that extends in facing relation with the PCB plate, wherein each base mount portion comprises a base cylinder portion, wherein the base cylinder portion extends beyond the base plate surface toward the PCB plate and is in engagement with a respective PCB mount portion, wherein each flexure comprises a flexible rib that extends between the base cylinder portion and the remainer of the base plate.

20. The apparatus according to claim 16
wherein the digital camera further includes
a temperature sensor, wherein the temperature sensor is operative to sense temperature adjacent to the PCB plate, circuitry, wherein the circuitry is in operative connection with the electronic image sensor and the temperature sensor, wherein the circuitry is operative responsive at least in part to the temperature sensor to compensate for temperature drift of image data captured through operation of the electronic image sensor.

* * * * *